(12) United States Patent
Yoon et al.

(10) Patent No.: US 9,514,936 B2
(45) Date of Patent: Dec. 6, 2016

(54) PARTICLE AND METHOD FOR MANUFACTURING SAME

(75) Inventors: Kyung Byung Yoon, Seoul (KR); Phil Kook Son, Busan (KR); Hye Ryeong Park, Seoul (KR)

(73) Assignee: INDUSTRY-UNIVERSITY COOPERATION FOUNDATION SOGANG UNIVERSITY, Seoul (KR)

(*) Notice: Subject to any disclaimer, the term of this patent is extended or adjusted under 35 U.S.C. 154(b) by 60 days.

(21) Appl. No.: 13/570,625

(22) Filed: Aug. 9, 2012

(65) Prior Publication Data

US 2013/0040145 A1 Feb. 14, 2013

Related U.S. Application Data

(63) Continuation of application No. PCT/KR2011/000848, filed on Feb. 9, 2011.

(30) Foreign Application Priority Data

Feb. 9, 2010 (KR) .................. 10-2010-0012050

(51) Int. Cl.
*H01L 21/02* (2006.01)

(52) U.S. Cl.
CPC ..... *H01L 21/02439* (2013.01); *H01L 21/0259* (2013.01); *H01L 21/02521* (2013.01); *Y10T 428/2991* (2015.01)

(58) Field of Classification Search
CPC .............. H01L 21/02521; H01L 21/0259; H01L 21/02439
USPC ............................................. 427/216
See application file for complete search history.

(56) References Cited

U.S. PATENT DOCUMENTS 3,773,567 A * 11/1973 Gillespie .................. 438/94
4,965,967 A * 10/1990 London ..................... 451/50

(Continued)

FOREIGN PATENT DOCUMENTS

JP      2009-013454 A       1/2009
JP      2009013454    *     1/2009  ............. C23C 18/31

(Continued)

OTHER PUBLICATIONS

Shi, Gold Nanoshells on Polystyrene Cores for Control of Surface Plasmon Resonance, Langmuir 2005, 21, p. 1610-1617.*
Ye, Fabrication and Chemical Transformation of Bimetallic "Janus" Particles, 2009 WV STaR Research Symposium, Apr. 15, 2009, p. 1-16.*

(Continued)

*Primary Examiner* — Tabatha Penny
(74) *Attorney, Agent, or Firm* — Brundidge & Stanger, P.C.

(57) ABSTRACT

Manufacturing a particle may include inserting a supporting body into a receiving groove on a first substrate to accommodate a first surface of the supporting body into the receiving groove and to expose a second surface of the supporting body to outside; forming a first coating layer on the second surface; attaching a second substrate to the supporting body on which the first coating layer is formed; exposing the first surface of the supporting body on which the first coating layer is formed to outside, by separating the supporting body on which the first coating layer is formed and which is attached to the second substrate from the first substrate; forming a second coating layer on the first surface of the supporting body; and separating the supporting body, on which the first coating layer and the second coating layer are formed, from the second substrate.

14 Claims, 9 Drawing Sheets

(56) References Cited

U.S. PATENT DOCUMENTS

| | | | |
|---|---|---|---|
| 5,484,074 A * | 1/1996 | Deibler et al. | 216/12 |
| 6,881,448 B1 * | 4/2005 | Hattori | 427/307 |
| 6,982,047 B2 * | 1/2006 | Uchida | 252/513 |
| 2004/0131688 A1 | 7/2004 | Dov | |
| 2005/0231075 A1 * | 10/2005 | Xu | 310/328 |
| 2006/0103316 A1 | 5/2006 | Wang | |
| 2006/0234417 A1 | 10/2006 | Isobe | |

FOREIGN PATENT DOCUMENTS

| KR | 10-2006-0118161 | 11/2006 |
|---|---|---|
| WO | 2007129682 A1 | 11/2007 |

OTHER PUBLICATIONS

Adams, Influence of particle surface roughness on the behaviour of Janus particles at interfaces, Colloids and Surfaces A: Physicochem. Eng. Aspects 317 (2008), p. 360-365.*

Liz-Martin, et al., "Synthesis of Nanosized Gold-Silica Core-Shell Particles", Langmuir, Feb. 29, 1996, 12, pp. 4329-4335, American Chemical Society.

Office Action for JP patent application No. 2012-552800 w/English translation.

International Search Report from International Application No. PCT/KR2011/000848 mailed Nov. 11, 2011.

* cited by examiner

PARTICLE AND METHOD FOR MANUFACTURING SAME

CROSS-REFERENCE TO RELATED APPLICATION

This application is a Continuation of International Application No. PCT/KR2011/000848 filed Feb. 9, 2011, which claims the benefits of Korean Patent Application No. 10-2010-0012050 filed Feb. 9, 2010. The entire disclosure of the prior application is incorporated herein by reference in its entirety.

TECHNICAL FIELD

The present disclosure relates to a particle and a method for manufacturing the particle, in particular, a particle in various shapes having a size ranging from several nanometers (nm) to tens of micrometers (μm), and a method for manufacturing the particle.

BACKGROUND ART

Arranging nano- or micro-particles in a certain array state is a very essential realm in the modern science and technology. In order to use the particle array for high precision materials and devices, particles should be arranged in an array of at least several mm having no significant defect. Further, thorough adjustment in crystal orientation and lattice symmetry is required.

Conventionally, in order to arrange particles, a method that arranges particles on a substrate has been used. However, since a particle array formed by the method has a layered structure, the particle array could not have a sufficient surface area. Further, since a size of the particles of the array is merely a micro level, integration density could not have been improved.

In order to solve the problems, development of a particle having a nano-level size and an excellent surface area and an array including the particle has been urgently needed.

DISCLOSURE OF THE INVENTION

Problems to be Solved by the Invention

The present disclosure has been made to solve the foregoing problems, and provides a particle, which has at least a nano-level size, and on which a uniformed and smooth coating layer is formed, and a method for manufacturing the particle.

However, the problems sought to be solved by the present disclosure are not limited to the above-described problems. Other problems, which are sought to be solved by the present disclosure but are not described in this document, can be clearly understood by those skilled in the art from the descriptions below.

Means for Solving the Problems

In accordance with a first aspect of the present disclosure, there is provided a method for manufacturing a particle, comprising: a step of inserting a supporting body into a receiving groove on a first substrate to accommodate a first surface of the supporting body into the receiving groove and to expose a second surface of the supporting body to outside; a step of forming a first coating layer on the second surface; a step of attaching a second substrate to the supporting body on which the first coating layer is formed; a step of exposing the first surface of the supporting body on which the first coating layer is formed to outside, by separating the supporting body on which the first coating layer is formed and which is attached to the second substrate from the first substrate; a step of forming a second coating layer on the first surface of the supporting body; and a step of separating the supporting body, on which the first coating layer and the second coating layer are formed, from the second substrate.

In accordance with another aspect of the present disclosure, there is provided a particle, comprising: supporting body having a first surface and a second surface; first coating layer coated on the second surface of the supporting body; and second coating layer coated on the first surface of the supporting body.

In accordance with still another aspect of the present disclosure, there is provided a particle array, comprising particles of any one of claims 17 to 24.

Effect of the Invention

Since the particle of the present disclosure is manufactured by forming a coating layer on a surface of a supporting body in various sizes and shapes, it is possible to easily manufacture a particle having a size of a nano-level to a micro-level. Since the particle of the present disclosure has a uniformed and smooth coating layer, it produces an effect in easily manufacturing a module and maximizing integration density. A particle array including the particle can be utilized in various fields such as an artificial photosynthesis field and the likes.

BEST MODE FOR CARRYING OUT THE INVENTION

Hereinafter, embodiments and examples of the present disclosure will be described in detail with reference to the accompanying drawings so that inventive concept may be readily implemented by those skilled in the art.

However, it is to be noted that the present disclosure is not limited to the embodiments and the examples but can be realized in various other ways. In the drawings, certain parts not directly relevant to the description are omitted to enhance the clarity of the drawings, and like reference numerals denote like parts throughout the whole document.

Throughout the whole document, the term "comprises or includes" and/or "comprising or including" used in the document means that one or more other components, steps, operations, and/or the existence or addition of elements are not excluded in addition to the described components, steps, operations and/or elements.

The terms "about or approximately" or "substantially" are intended to have meanings close to numerical values or ranges specified with an allowable error and intended to prevent accurate or absolute numerical values disclosed for understanding of the present invention from being illegally or unfairly used by any unconscionable third party.

A method for manufacturing a particle in accordance with an aspect of the present disclosure includes, a step of inserting a supporting body into a receiving groove on a first substrate to accommodate a first surface of the supporting body into the receiving groove and to expose a second surface of the supporting body to the outside; a step of forming a first coating layer on the second surface; a step of attaching a second substrate to the supporting body, on which the first coating layer is formed; a step of exposing the first surface of the supporting body, on which the first coating layer is formed, to the outside, by separating the supporting body, on which the first coating layer is formed, and which is attached to the second substrate, from the first substrate; a step of forming a second coating layer on the first surface of the supporting body; and a step of separating the supporting body, on which the first coating layer and the second coating layer are formed, from the second substrate.

In an embodiment, inserting the supporting body into the receiving groove may be performed by a process including dispersing the supporting body on the first substrate, and then, applying a physical pressure thereto. However, the present disclosure is not limited thereto. In an exemplary embodiment, the physical pressure may be applied by rubbing or pressing against the substrate. However, the present disclosure is not limited thereto.

In another embodiment, the step of forming the first coating layer and the step of forming the second coating layer may include vacuum evaporation, sputtering, or spin coating to form each of the first coating layer and the second coating layer, independently. However, the present disclosure is not limited thereto. In an exemplary embodiment, the vacuum evaporation may be performed at a pressure of about $10^{-2}$ torr to about $10^{-3}$ torr. However, the present disclosure is not limited thereto. In an exemplary embodiment, the vacuum evaporation may be performed at a temperature of about 10° C. to about 300° C. However, the present disclosure is not limited thereto.

In still another embodiment, the second substrate may further include a polymer layer. However, the present disclosure is not limited thereto. As the polymer layer, any polymer layer may be used without limitation if the polymer layer can be easily separated or removed from the second substrate by heat or light irradiation. For example, the polymer layer may include polyetherimide (PEI). However, the present disclosure is not limited thereto. In an exemplary embodiment, the step of separating the supporting body, on which the first coating layer and the second coating layer are formed, from the second substrate may include heating and removing the polymer layer. However, the present disclosure is not limited thereto.

In still another embodiment, the method for manufacturing a particle may further include a step of uniformalizing the first coating layer and the second coating layer formed on the supporting body after the step of separating the supporting body, on which the first coating layer and the second coating layer are formed, from the second substrate. However, the present disclosure is not limited thereto. In an exemplary embodiment, the step of uniformalizing the first coating layer and the second coating layer may include placing the supporting body, on which the first coating layer and the second coating layer are formed, between a nanostage and a plate, and then, rotating and moving linearly the nanostage. However, the present disclosure is not limited thereto.

In an exemplary embodiment, the step of uniformalizing the first coating layer and the second coating layer may further include oxidizing the first coating layer and the second coating layer at a temperature of about 100° C. to about 500° C. However, the present disclosure is not limited thereto.

In still another embodiment, the first coating layer and the second coating layer may include the same material or different materials. However, the present disclosure is not limited thereto.

In still another embodiment, a thickness of each of the first coating layer and the second coating layer may be independently from about 1 nm to about 10,000 nm. However, the present disclosure is not limited thereto.

In still another embodiment, each of the first coating layer and the second coating layer may independently include a material selected from the group consisting of a single element metal, an alloy, a single element nonmetal, a nonmetal mixture, a metal-nonmetal mixture, a chalcogenide of nonmetal mixture, a nitride, a phosphide, a halide, and their combinations. However, the present disclosure is not limited thereto.

In still another embodiment, the first substrate may include a silicon (Si) or polymer. However, the present disclosure is not limited thereto. For example, the polymer may include polydimethylsiloxane or polymethylmethacrylate. However, the present disclosure is not limited thereto.

In still another embodiment, an average size of the supporting body may be from about 1 nm to about 100,000 nm. However, the present disclosure is not limited thereto.

In still another embodiment, the supporting body may include silica ($SiO_2$). However, the present disclosure is not limited thereto.

In still another embodiment, the supporting body may have a shape selected from the group consisting of a sphere, an oval figure, a pentagonal prism, a hexagonal prism, an octagonal prism, a heptagonal prism, a cylinder, a hexagonal prism with a rounded corner, a hexahedron, a hexahedron with a rounded corner, and their combinations. However, the present disclosure is not limited thereto.

A particle in accordance with another aspect of the present disclosure may include, a supporting body having a first surface and a second surface; a first coating layer coated on the second surface of the supporting body; and a second coating layer coated on the first surface of the supporting body.

In an embodiment, a size of the supporting body may be from about 1 nm to about 100,000 nm. However, the present disclosure is not limited thereto.

In another embodiment, the supporting body may have a shape selected from the group consisting of a sphere, an oval figure, a pentagonal prism, a hexagonal prism, an octagonal prism, a heptagonal prism, a cylinder, a hexagonal prism with a rounded corner, a hexahedron, a hexahedron with a rounded corner, and their combinations. However, the present disclosure is not limited thereto.

In still another embodiment, the supporting body may include silica ($SiO_2$). However, the present disclosure is not limited thereto.

In still another embodiment, each of the first coating layer and the second coating layer may independently include a material selected from the group consisting of a single element metal, an alloy, a single element nonmetal, a nonmetal mixture, a metal-nonmetal mixture, a chalcogenide of nonmetal mixture, a nitride, a phosphide, a halide, and their combinations. However, the present disclosure is not limited thereto.

In still another embodiment, each of the first coating layer and the second coating layer may independently include a material selected from the group consisting of W—Ti, Ti, W, CdS, CdSe, CdMnTe, GaP, Si, SiC, $TiO_2$, SiO, SiOC, SiON, $ZnO_2$, $SrTiO_3$, $FeTiO_3$, $MnTiO_3$, $BaTiO_3$, $ZrO_2$, $Nb_2O_5$, $KTaO_3$, $WO_3$, $Fe_2O_3$, $SnO_2$, and their combinations. However, the present disclosure is not limited thereto.

In still another embodiment, a thickness of each of the first coating layer and the second coating layer may be independently from about 1 nm to about 10,000 nm. However, the present disclosure is not limited thereto.

In still another embodiment, the first coating layer and the second coating layer may include the same material or different materials. However, the present disclosure is not limited thereto.

A particle array in accordance with still another aspect of the present disclosure includes the above-described particle of the present disclosure. Descriptions of the particle array and the particle may include all the descriptions of the method for manufacturing the particle. For convenience in description, overlapping descriptions in this regard are omitted.

Hereinafter, the particle and the method for manufacturing the particle of the present disclosure will be described in detail with reference to the drawings. However, the present disclosure is not limited thereto.

Figure 1:
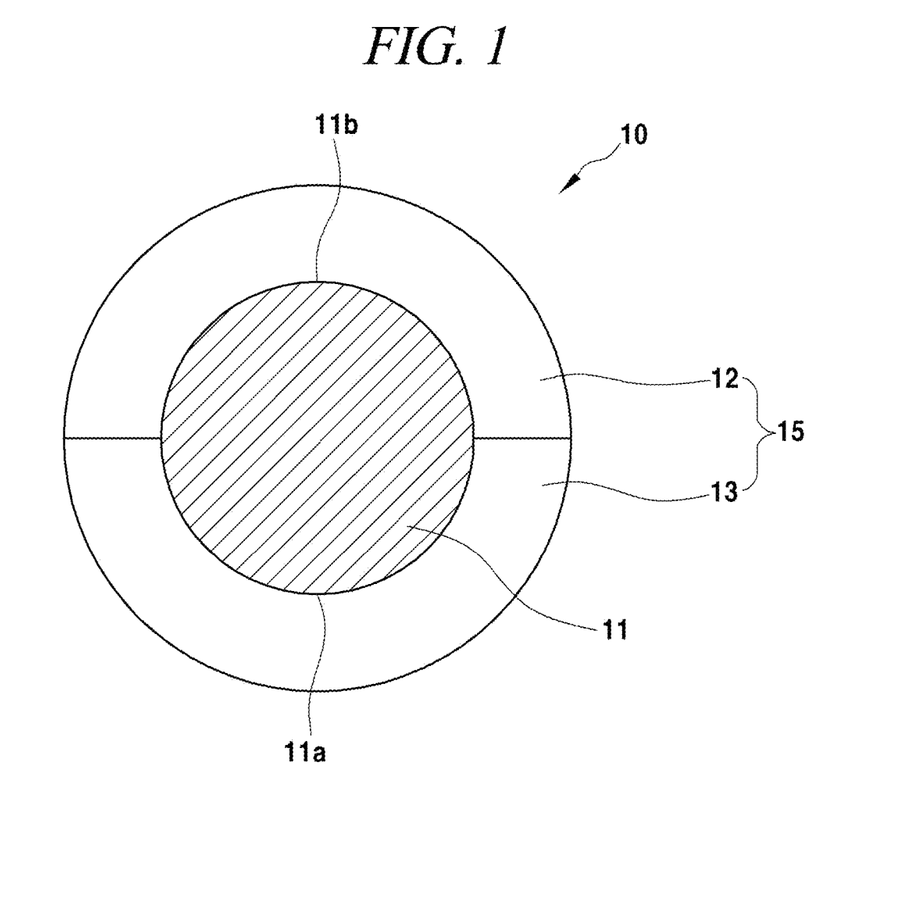
FIG. 1 is a cross sectional view of a particle in accordance with an embodiment of the present disclosure.

FIG. 1 is a cross sectional view of a particle 10 in accordance with an embodiment of the present disclosure.

In case of using a conventional method that manufactures a particle through a direct method using a material functioning as a particle, it has been difficult to manufacture a particle having a size in various ranges and an excellent surface area, e.g., a sphere particle. Thus, in order to easily manufacture a particle 10 having a size of several nanometers (nm) to tens of micrometers (μm) and an excellent surface area, the present disclosure uses an indirect method. More specifically, the present disclosure manufactures the particle 10 in a nano size and a sphere shape by forming a supporting body 11 functioning as a frame by using a material, which various spheres or other various shapes having a nano size can be easily formed, and then, coating the supporting body 11 with a coating layer 15 functioning as the particle 10.

Figure 2:
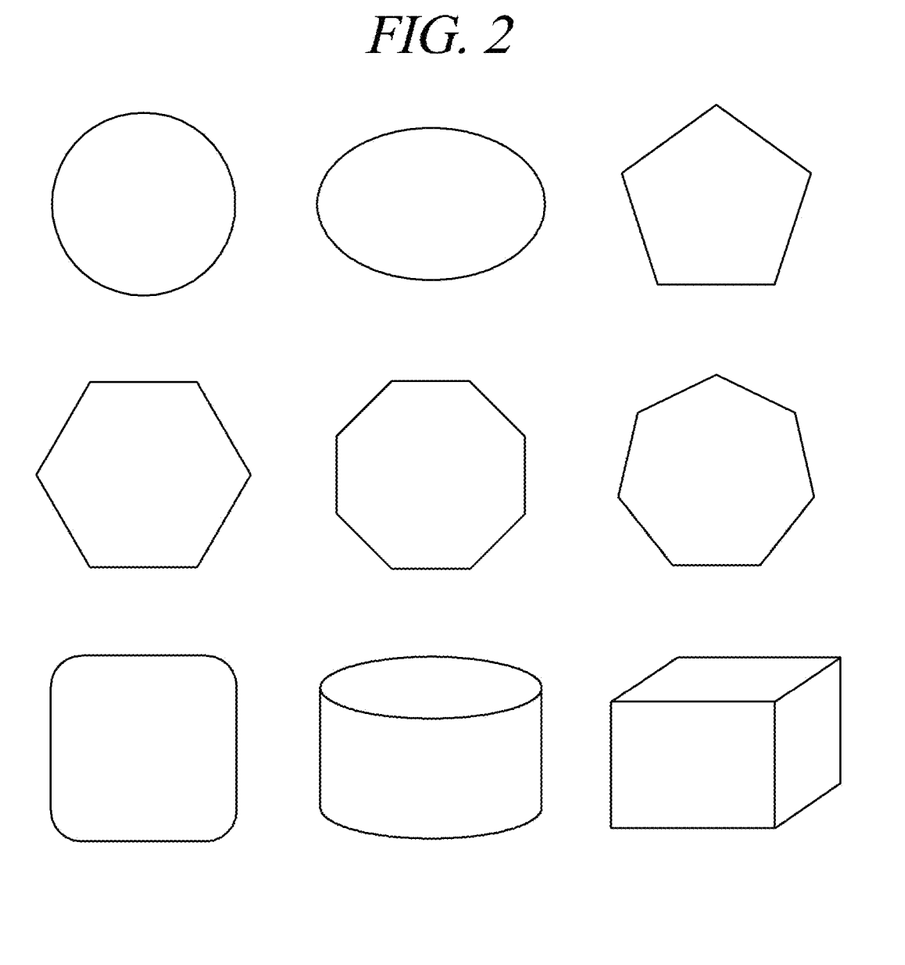
FIG. 2 illustrates cross sections of particles in various shapes in accordance with an embodiment of the present disclosure.

Hereinafter, the sphere supporting body 11 and the sphere particle 10 manufactured by using the supporting body 11 will be described as embodiments and examples. However, the shapes of the supporting body and the particle are not limited. As illustrated in FIG. 2, the shapes of the supporting body and the particles may include various shapes having a cross section of a sphere, an oval figure, a pentagonal prism, a hexagonal prism, an octagonal prism, a heptagonal prism, a cylinder, a hexahedron, a hexagonal prism with a rounded corner, or a hexahedron with a rounded corner.

In an embodiment, the supporting body 11 may have an average size of from about 1 nm to about 100,000 nm. If the average size of the supporting body 11 is below 1 nm, the size is overly tiny so that manufacturing the particle 10 becomes difficult. If the average size of the supporting body 11 exceeds 100,000 nm, a whole dimension of the supporting body 11 becomes overly large, the surface area and the integration density may be degraded. The average size of the supporting body is an average value of a circumscribed circle diameter and an inscribed circle diameter of the supporting body 11.

As materials for the supporting body 11, any materials may be used without limitation if a shape having a nano to micro size can be easily manufactured from the materials, and the materials are thermally and chemically stable. For example, the supporting body may include silica ($SiO_2$). From the silica, the sphere supporting body 11 with a nano size can be easily manufactured. The silica is thermally and chemically stable and has excellent shape stability. As such, the silica is advantageous in stably maintaining the coating layer 15 for a long time.

A first surface 11a and a second surface 11b are formed on an upper portion and a lower portion of the supporting body 11, respectively. A second coating layer 13 is coated on the first surface 11a. A first coating layer 12 is coated on the second surface 11b.

A coating layer 15 coated on the supporting body may have a thickness of about 1 nm to about 10,000 nm. If the thickness of the coating layer 15 is below 1 nm, efficiency upon development of uses may be deteriorated. If the thickness of the coating layer 15 exceeds 10,000 nm, the whole dimension of the particle 10 becomes large, so that the integration density and the surface area may be degraded.

The first coating layer 12 and the second coating layer 13 may be in the same size or different sizes. In other words, a surface area of the first coating layer 12 and a surface area of the second coating layer 13 may be the same or different. This configuration can be easily understood with reference to a process, in which the surface area of the first coating layer 12 and the surface area of the second coating layer 13 become the same or different depending on a shape of a receiving groove 110 formed on the first substrate, in a method for manufacturing the particle 10, which will be described later.

Each of the first coating layer 12 and the second coating layer 13 may independently include at least one of a single element metal, an alloy, a single element nonmetal, a nonmetal mixture, a metal-nonmetal mixture, a chalcogenide of a nonmetal mixture, a nitride, a phosphide, and a halide. For example, the first coating layer 12 and the second coating layer 13 may include at least one of W—Ti, Ti, W, CdS, CdSe, CdMnTe, GaP, Si, SiC, $TiO_2$, SiO, SiOC, SiON, $ZnO_2$, $SrTiO_3$, $FeTiO_3$, $MnTiO_3$, $BaTiO_3$, $ZrO_2$, $Nb_2O_5$, KTaO$_3$, WO$_3$, Fe$_2$O$_3$, and SnO$_2$. However, the present disclosure is not limited thereto.

The first coating layer 12 and the second coating layer 13 may be formed of the same material. However, if necessary, the first coating layer 12 and the second coating layer 13 may be formed of materials having different properties. For example, one particle 10 may be coated with a material having an oxidization function and a material having a reduction function as the first coating layer 12 and the second coating layer 13, respectively, so that the coated particle 10 can realize the oxidization function and the reduction function at the same time.

Hereinafter, a method for manufacturing the particle 10 in accordance with an embodiment of the present disclosure will be specifically described. Detailed descriptions of the same components as described above such as the supporting body 11 and the coating layer 15 will be omitted.

Figure 3:
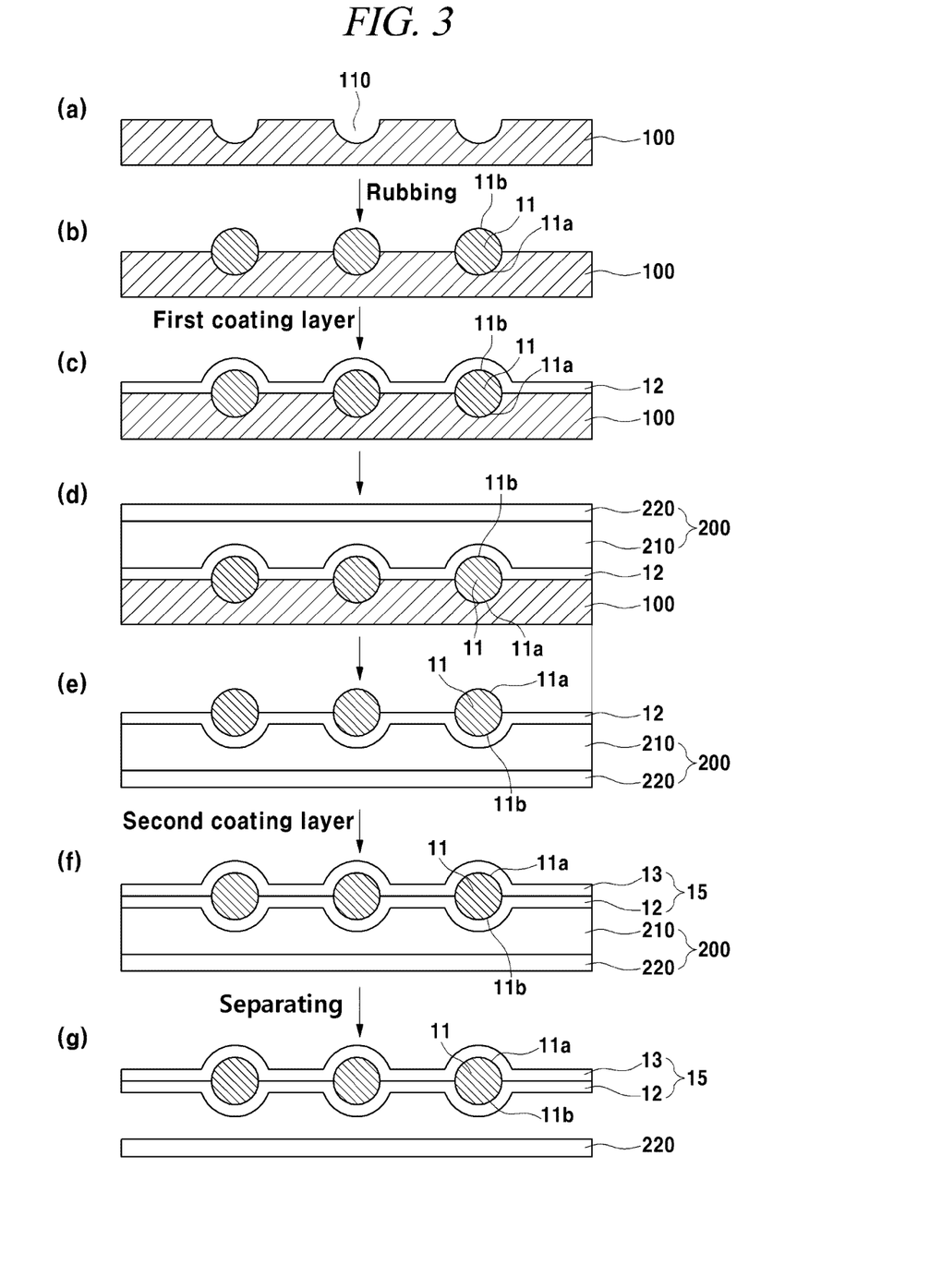
FIG. 3 is a process diagram for manufacturing a particle in accordance with an embodiment of the present disclosure.

FIG. 3 illustrates a process diagram for manufacturing the sphere particle 10 with a nano size in accordance with an embodiment of the present disclosure. First, as illustrated in FIG. 3a, a first substrate 100 having a certain receiving groove 110 is prepared. The receiving groove 110 has a function of receiving the above-described supporting body 11. The receiving groove 110 may have a shape similar to that of the supporting body 11 such that the supporting body 11 can be easily inserted into the receiving groove 110.

The receiving groove 110 may be less than half the size of the supporting body 11. In this case, it is possible to more easily carry out the process for attaching the second substrate to the first coating layer 12, and then, separating the supporting body 11, on which the first coating layer 12 is coated, from the first substrate after forming the first coating layer 12 on the supporting body 11 inserted into the receiving groove of the first substrate. The first substrate may include a silicon (Si) or polymer material. The polymer material may include polydimethylsiloxane or polymethylmethacrylate. However, the present disclosure is not limited thereto.

As the supporting body 11 in accordance with an example of the present disclosure, a silica supporting body was used. In order to manufacture the silica supporting body 11, tetraethylorthosilicate (TEOS) was added to an ethanol and ammonium hydroxide (NH$_4$OH) solvent by using a spray and mixed therein. Thereafter, the mixture was centrifuged and cleaned with ethanol so that silica (SiO$_2$) powders were obtained. Subsequently, the manufactured silica powders were melted in toluene, and then, aminopropyltriethoxysilane (APS) was added thereto by using a spray to be refluxed for about 5 hours. Thereafter, cleaning with toluene, filtering, and drying are performed, so that the silica supporting body 11 having a particle size of ~650 nm was manufactured.

Next, as illustrated in FIG. 3b, the supporting body 11 is inserted into the receiving groove 110 of the first substrate 100. As a result of the insertion, the supporting body 11 has the first surface 11a of the supporting body 11, which is accommodated in the receiving groove 110, and the second surface 11b of the supporting body 11, which is exposed to the outside.

The process of inserting the supporting body 11 into the receiving groove 110 may be performed by various methods. The process may be performed by applying a physical pressure to the supporting body. Non-limited examples of the method for applying a physical pressure to the supporting body may include rubbing or pressing against the substrate. However, the present disclosure is not limited thereto. As the pressure, a sufficient pressure enough for the supporting body 11 to be easily inserted into the receiving groove 110 on the first substrate 100 and fixed therein may be applied.

The rubbing means simply applying a physical pressure to the supporting body so as to form a physical or chemical bond on the supporting body and the first substrate. The chemical bond may include a hydrogen bond, an ionic bond, a covalent bond, a coordinate covalent bond, or the Van der Waales bond. Preferably, the chemical bond may include ionic bond or a hydrogen bond. The rubbing may be performed by using a bare hand or a hand wearing a rubber glove to apply a pressure to the supporting body. Alternative the rubbing may be performed using a rubbing instrument or a rubbing machine to apply a pressure to the supporting body. However, the present disclosure is not limited thereto.

Unlike a conventional technology for insertion using particles dispersed in a solvent, the method for inserting the supporting body through the physical pressure is very simple without requiring precise adjustment of a temperature and humidity. Further, since the supporting body moves rapidly on the first substrate in a desired direction, it is possible to prevent the movement of the supporting body on the first substrate from being affected by surface characteristics (e.g., hydrophobicity, charge, and roughness). In the conventional technology using particles dispersed in a solvent, and thus the supporting body is not easily inserted into the receiving groove due to a capillary phenomenon of the solve it is irregular whether the supporting body is inserted or not. However, since the present disclosure inserts the supporting body directly into an insertion portion by applying a physical pressure to the supporting body, the supporting body can be inserted into any insertion portion.

Next, as illustrated in FIG. 3c, the first coating layer 12 is formed on the second surface 11b of the supporting body 11, which is exposed to the outside. In an embodiment, forming the first coating layer may be performed through a process of depositing metals such as titanium (Ti) on the second surface 11b of the supporting body 11 by using vacuum evaporation, sputtering, or spin coating. The vacuum evaporation deposition process may be performed in an atmosphere of an argon gas and about $10^{-2}$ torr to about $10^{-3}$ torr, at about 40 watts to about 150 watts, and at a temperature of about 10° C. to about 300° C. The condition needs to be set in a range enabling the first coating layer 12 to be easily adhered to the supporting body 11. The reason for the range lies in preventing damage to the coating layer 15 during the process for separating the supporting body 11 attached to the second substrate 200, which will be described later, from the first substrate 100. That is, if the supporting body 11 is strongly attached to the first substrate 100, and the adhering force of the first coating layer 12 of the supporting body 11 is weak, the first coating layer 12 may be taken off during the separating process.

Subsequently, as illustrated in FIG. 3d, the second substrate 200 is attached to the supporting body 11, on which the first coating layer 12 formed. The second substrate 200 has a function of easily separating the supporting body 11 from the first substrate 100, and furthermore, functions as a supporter for easily coating the first surface 11a of the supporting body 11.

The first coating layer 12 may include at least one of a single element metal, an alloy, a single element nonmetal, a nonmetal mixture, a metal-nonmetal mixture, a chalcogenide of nonmetal mixture, a nitride, a phosphide, and a halide. For example, the first coating layer 12 and the second coating layer 13 may include at least one of W—Ti, Ti, W, CdS, CdSe, CdMnTe, GaP, Si, SiC, TiO$_2$, SiO, SiOC, SiON, $ZnO_2$, $SrTiO_3$, $FeTiO_3$, $MnTiO_3$, $BaTiO_3$, $ZrO_2$, $Nb_2O_5$, $KTaO_3$, $WO_3$, $Fe_2O_3$, and $SnO_2$. However, the present disclosure is not limited thereto.

An embodiment for attaching the second substrate 200 to the supporting body 11, on which the first coating layer 12 is coated, will be described in more detail. Polymer such as polyetherimide is coated on a glass plate 220 through spin coating to prepare a second substrate, on which the polymer layer 210 is coated. Thereafter, the polymer layer 210 formed on the second substrate is mounted in the supporting body 11, on which the first coating layer 12 is coated. Subsequently, a pressure is applied to attach the second substrate 200 to the supporting body 11, on which the first coating layer 12 is coated.

Finally, as illustrated in FIG. 3e, the supporting body 11 attached to the second substrate 200 is separated from the first substrate 100 to expose the first surface 11a of the supporting body 11 to the outside. Since the receiving groove 110 of the first substrate 100 is physically weakly attached to the first surface 11a of the supporting body 11, the first substrate 100 can be easily separated from the supporting body 11. If the supporting body 11 is not easily separated from the first substrate 100, the supporting body 11 attached to the second substrate 200 may be more easily separated from the first substrate 100 by further performing a process of applying heat to the first substrate 100.

Thereafter, as illustrated in FIG. 3f, a process for forming the second coating layer 13 on the first surface 11a of the supporting body 11 is performed. Accordingly, the whole surface of the supporting body 11 is formed of the coating layer 15. The process for forming the second coating layer may be performed by the same method as the aforementioned process for coating the first coating layer 12 on the second surface 11b of the supporting body 11. For convenience in description, overlapping descriptions in this regard are omitted.

The second coating layer 13 may include at least one of a single element metal, an alloy, a single element nonmetal, a nonmetal mixture, a metal-nonmetal mixture, a chalcogenide of nonmetal mixture, a nitride, a phosphide, and a halide. For example, the first coating layer 12 and the second coating layer 13 may include at least one of W—Ti, Ti, W, CdS, CdSe, CdMnTe, GaP, Si, SiC, $TiO_2$, SiO, SiOC, SiON, $ZnO_2$, $SrTiO_3$, $FeTiO_3$, $MnTiO_3$, $BaTiO_3$, $ZrO_2$, $Nb_2O_5$, $KTaO_3$, $WO_3$, $Fe_2O_3$, and $SnO_2$. However, the present disclosure is not limited thereto.

The second coating layer 13 may be the same material as the first coating layer 12, or the first coating layer 12 and the second coating layer 13 may be materials having different function. If one supporting body 11 is coated with materials having different functions, the integration density can increase, thereby, improving the efficiency in development of uses.

Next, as illustrated in FIG. 3g, a process for separating the supporting body 11, on which the first coating layer 12 and the second coating layer 13 are coated, from the second substrate 200 is performed. As a result, the supporting body 11, on which the first coating layer 12 and the second coating layer 13 are coated, can be solely obtained. For example, if a polymer layer is further formed on the second substrate, the separating process may etch and remove the polymer layer further formed on the second substrate 200 by using a chemical method, i.e., acid, through an Ar ion beam or inductively coupled plasma (ICP), or burn and remove the polymer layer further formed on the second substrate 200 by using heat or light. The first coating layer 12 and the second coating layer 13 on the supporting body 11, manufactured as described above, may have a projected coating layer at their adhered portions. In this case, a process for removing the projected coating layer and smoothing the surface of the coating layer 15 is required.

Figure 4:
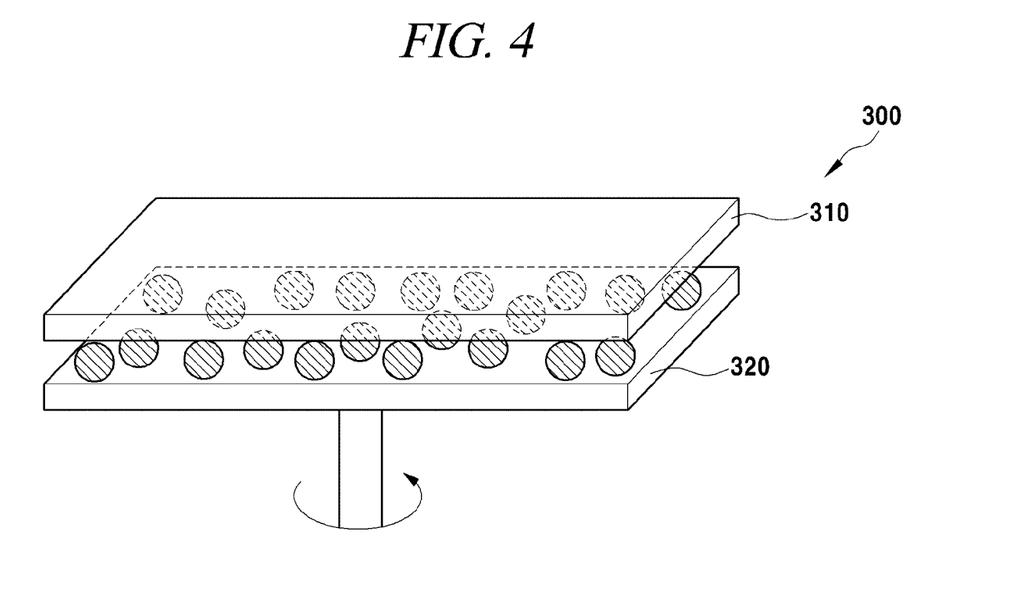
FIG. 4 illustrates a process diagram for uniformalizing a coating layer of a particle in accordance with an embodiment of the present disclosure.

FIG. 4 illustrates a process diagram for uniformalizing the coating layer 15 of the particle 10 in accordance with an embodiment of the present disclosure. As illustrated in FIG. 4, the process for uniformalizing the coating layer 15 of the supporting body 11 may be performed by using a uniformalizing device 300. More specifically, the supporting body 11 separated from the second substrate 200 is dispersed on a nanostage 320. An upper plate 310 is mounted in the dispersed supporting body 11. Thereafter, the nanostage 320 rotates and/or linearly moves so that the coating layer 15 of the supporting body 11 can be uniformalized. Through the process, the coating layer 15 projected on the surface of the supporting body 11 is removed, and the coating layer 15 becomes smooth and uniformed.

In order to uniformalize the coating layer 15 of the supporting body 11, a space between the nanostage 320 and the upper plate 310 may be set to be the same as a diameter of the supporting body 11, on which the coating layer 15 is formed. However, the present disclosure is not limited thereto. If the space between the nanostage 320 and the upper plate 310 is smaller than the diameter of the coated supporting body 11, the coating layer 15 of the supporting body 11 may be damaged. In the reverse case, the coating layer 15 projected on the surface of the supporting body 11 may not be easily removed.

In an embodiment, the process for uniformalizing the coating layer 15 of the supporting body 11 may further include a process for oxidizing the coating layer 15 of the supporting body 11 at a temperature of about 100° C. to about 500° C. in the state that an oxygen gas is applied. For example, if the coating layer 15 includes a metal, the metal coating layer 15 of the supporting body 11 can be converted into a metal oxide coating layer 15 through the oxidizing process. The metal oxide may exhibit a semiconductor property or an insulator property depending on a type of the metal.

Alternatively, the method for manufacturing the particle 10 in the present disclosure may be performed further including a process for selectively removing an unnecessary coating layer 15 formed on the first substrate 100 and the second substrate 200, without removing the coating layer 15 formed on the surface of the supporting body 11, in the above-described processes. In this case, the process for uniformalizing the coating layer 15 of the supporting body 11 may be omitted. The surface of the coating layer 15 can become smoother. The process for selectively removing the coating layer 15 formed on the first substrate 100 and the second substrate 200 may be performed after the process for coating the first coating layer 12 and the second coating layer 13. That is, the coating layer 15 formed on the first substrate 100 and the second substrate 200 can be selectively removed through a process for coating a photoresister layer on the coating layer 15, putting a photo mask on the photoresister layer, irradiating an ultraviolet ray thereon, spraying a development solution, and carrying out etching.

Through the above-described process, the present disclosure can manufacture the particle 10 provided with the coating layer 15 on the whole surface of the supporting body 11. Since the particle 10 has various sizes of several nanos to tens of micros, it can provide lots of application possibilities in the present-day scientific civilization.

Hereinafter, the present disclosure will be described in more detail with reference to examples. However, the present disclosure is not limited to the examples.

Example 1

Figure 5:
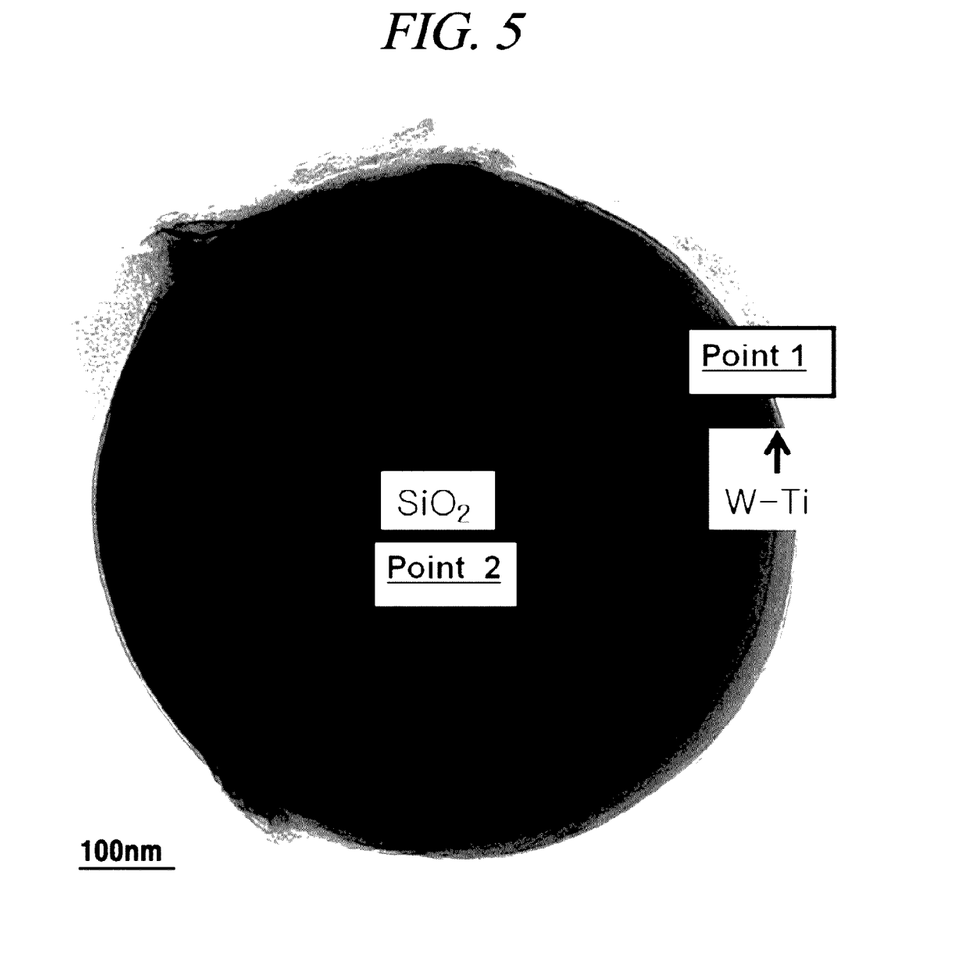
FIG. 5 provides a photograph obtained from observation of a PDMS substrate, on which a W—Ti coating layer is coated, and which includes a $SiO_2$ supporting body, through an electron microscopy in accordance with an example of the present disclosure.

A sphere $SiO_2$ supporting body was inserted into a PDMS substrate having a sphere receiving groove with an average diameter of 650 nm through rubbing. Thereafter, W—Ti was deposited on the PDMS substrate, into which the supporting body was inserted, including an exposed surface of the $SiO_2$ supporting body through a RF sputtering process. More specifically, the RF sputtering deposition process was performed in an atmosphere of $2\times10^{-2}$ torr, a 50 sccm argon gas, and 25° C. in the state that the PDMS substrate for deposition was spaced with a deposition distance of about 5 cm by applying an r.f. power of 60 W for one minute. The thickness of the W—Ti coating layer was about 15 nm to about 20 nm. FIG. 5 provides a photograph obtained from observation of the PDMS substrate, on which the W—Ti coating layer formed by the above-described process was deposited, and which includes the $SiO_2$ supporting body, through an electron microscopy.

Figure 6:
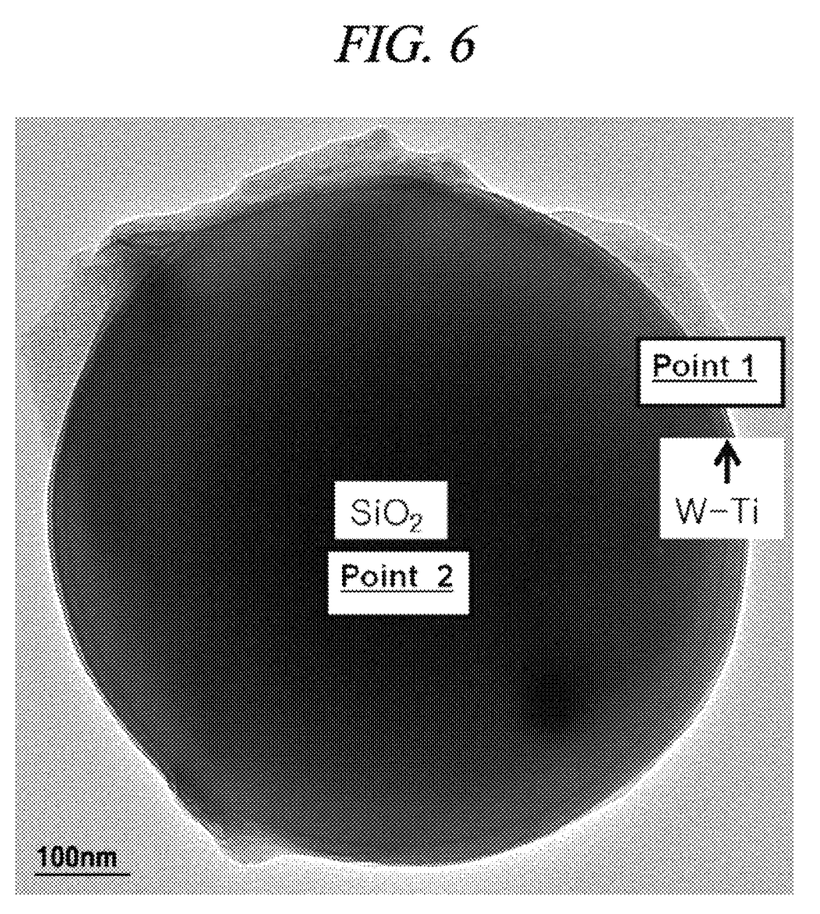
FIG. 6 provides a photograph obtained from observation of a cross section of a $SiO_2$ supporting body, on which W—Ti is coated, through a transmission electron microscopy (TEM) in accordance with an example of the present disclosure.

Subsequently, through a method that contacts a PEI/glass substrate including a glass substrate and a PEI layer formed on the glass substrate with the PDMS substrate, on which the W—Ti coating layer was formed, and then, separates the substrate, the $SiO_2$ supporting body on the PDMS substrate was transferred onto the PEI/glass substrate. Thereafter, W—Ti was further deposited onto one side surface of the $SiO_2$ supporting body, on which no W—Ti was deposited, through the RF sputtering process. More specifically, the RF sputtering deposition process was performed in an atmosphere of $2\times10^{-2}$ torr, a 50 sccm argon gas, and 25° C. for one minute. Also, the process was performed by applying an r.f. power of 45 W for about one minute in the state that the glass substrate was spaced with a deposition distance of about 2 cm. The thickness of the W—Ti deposition was about 15 nm to about 20 nm. Thereafter, the PEI layer was removed through firing, so that the $SiO_2$ supporting body with its whole surface being coated with W—Ti was separated from the glass substrate. FIG. 6 provides a photograph obtained from observation of the $SiO_2$ supporting body coated with W—Ti through a transmission electron microscopy (TEM). A composition ratio of the interior portion (Point 1) of the supporting body and the surface (Point 2) of the supporting body was analyzed as shown in Table 1 below. Table 1 confirms that the W—Ti coating layer has been deposited on the surface of the $SiO_2$ supporting body.

TABLE 1

| Element | Point 1 Weight % | Point 1 Atomic % | Point 2 Weight % | Point 2 Atomic % |
| --- | --- | --- | --- | --- |
| OK | 30.58 | 55.40 | 41.21 | 56.81 |
| SiK | 38.12 | 39.34 | 54.24 | 42.59 |
| TiK | 0.72 | 0.44 | 0.16 | 0.07 |
| WL | 30.58 | 4.82 | 4.40 | 0.53 |
| Totals | 100.00 | 100.00 | 100.00 | 100.00 |

Figure 7:
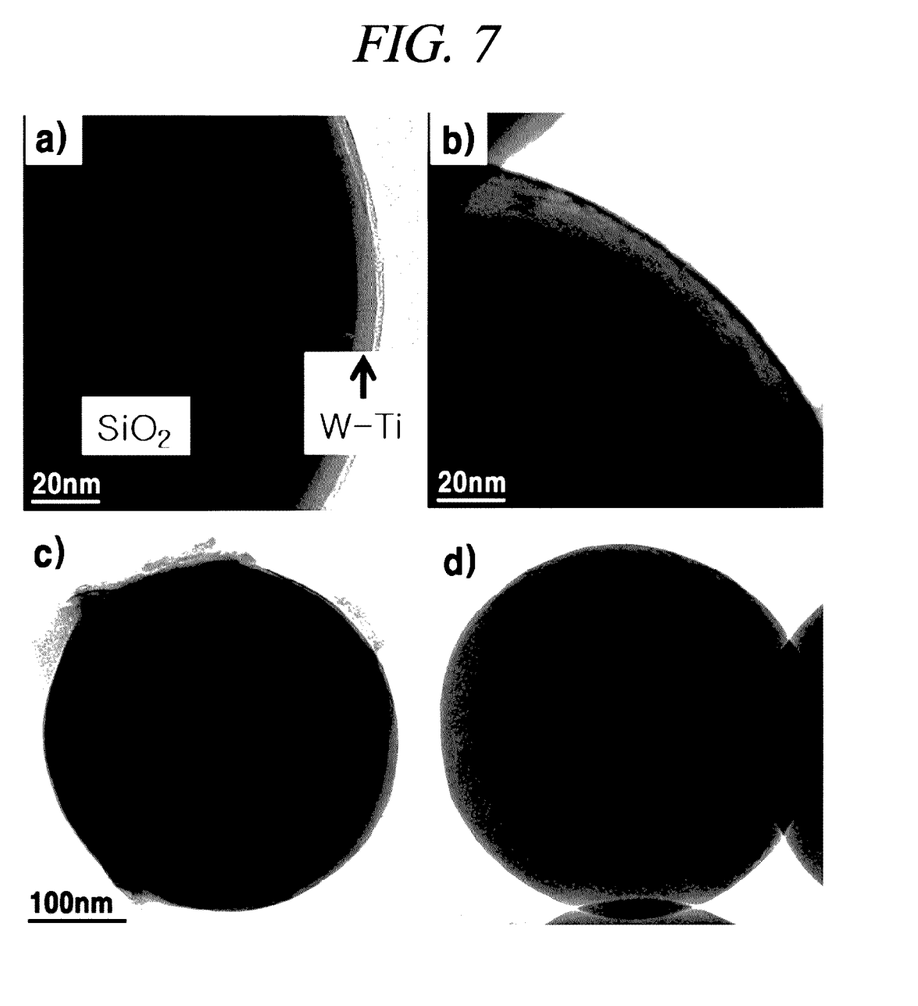
FIG. 7 provides photographs obtained from comparative observation between a cross section of a pristine $SiO_2$ supporting body, on which no W—Ti is coated, and a $SiO_2$ supporting body, on which W—Ti is coated, in accordance with an example of the present disclosure.

FIG. 7 provides comparative observation of a pristine $SiO_2$ supporting body, on which the W—Ti coating layer was not formed (FIG. 7*d*), and the $SiO_2$ supporting body, on which the W—Ti coating layer was formed (FIGS. 7*a* to 7*c*).

Example 2

Figure 8:
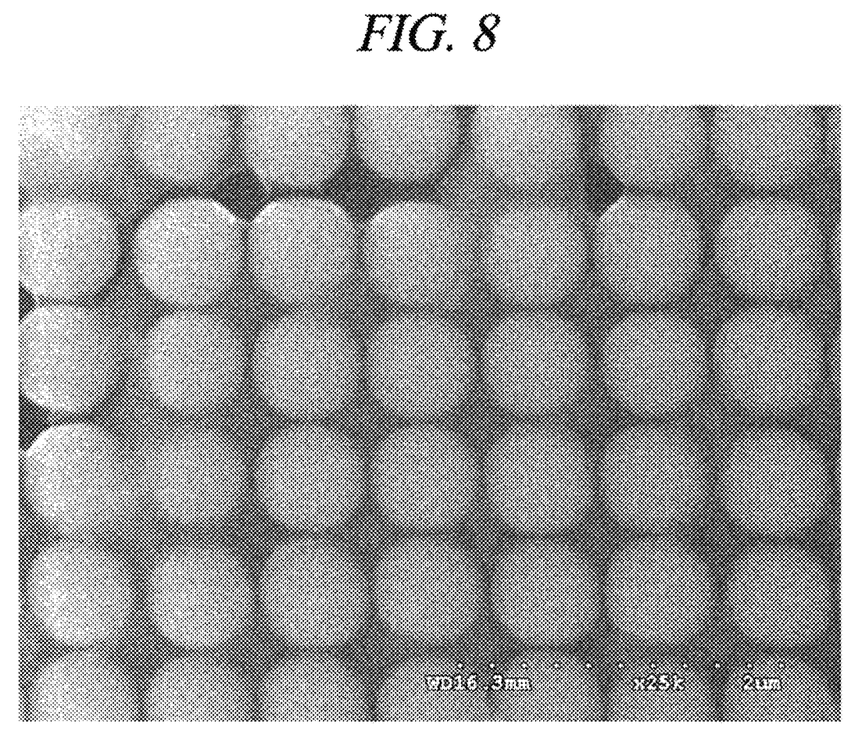
FIG. 8 provides a photograph obtained from observation of a PDMS substrate, on which an ITO coating layer is deposited, and which includes a $SiO_2$ supporting body, through an electron microscopy in accordance with an example of the present disclosure.

A sphere $SiO_2$ supporting body was inserted into a PDMS substrate having a sphere receiving groove with an average diameter 650 nm through rubbing. Thereafter, indium tin oxide (ITO: $In_2O_3/SnO_2$) was deposited on the PDMS substrate, into which the supporting body was inserted, including an exposed surface of the $SiO_2$ supporting body through a RF sputtering process. More specifically, a first RF sputtering deposition process was performed in an atmosphere of a pressure of $2\times10^{-2}$ torr, a mixture of an argon gas: $O_2$=50: 0.3 sccm, and 25° C. in the state that the PDMS substrate for deposition was spaced with a deposition distance of about 4 cm by applying an r.f. power of 60 W for about 10 minutes. The thickness of the ITO deposition was about 15 nm. FIG. 8 provides a photograph obtained from observation of the PDMS substrate, on which the ITO coating layer formed by the above-described process was deposited, and which includes the $SiO_2$ supporting body, through an electron microscopy.

Subsequently, through a method that contacts the PDMS substrate, on which the ITO was deposited, with a PEI/glass substrate including a glass substrate and a PEI layer formed on the glass substrate, and then, separates the substrate, the $SiO_2$ supporting body on the PDMS substrate, on which the ITO was coated was transferred onto the PEI/glass substrate. Thereafter, ITO was further deposited on one side surface of the $SiO_2$ supporting body, on which no ITO was deposited, through the RF sputtering process. More specifically, a second RF sputtering deposition process was performed in an atmosphere of $2\times10^{-2}$ torr, a mixture of an argon gas: $O_2$=50: 0.3 sccm, and 25° C. Also, the process was performed by applying an r.f. power of 100 W for about 20 minutes in the state that the glass substrate for deposition was spaced with a deposition distance of about 7.5 cm. The thickness of the ITO deposition was about 15 nm. Thereafter, the PEI layer was removed through firing, so that the $SiO_2$ supporting body with its whole surface being deposited with the ITO layer was separated from the glass substrate.

Figure 9:
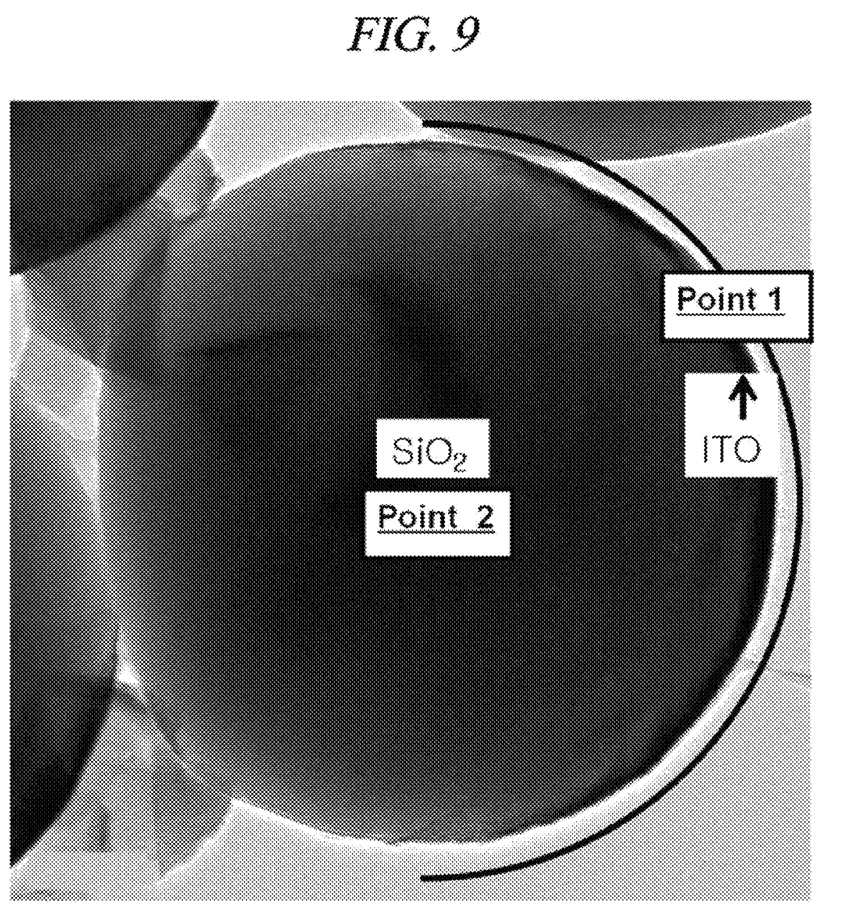
FIG. 9 provides a photograph obtained from observation of a cross section of a $SiO_2$ supporting body, on which ITO is coated, through a transmission electron microscopy in accordance with an example of the present disclosure.

FIG. 9 provides a photograph obtained from observation of the $SiO_2$ supporting body coated with ITO, provided by the aforementioned method, through a transmission electron microscopy (TEM). The thickness of the ITO coating layer was about 15 nm. A composition ratio of the interior portion (Point 1) of the supporting body and the surface (Point 2) of the supporting body was analyzed as shown in Table 2 below. Table 2 confirms that the ITO coating layer has been deposited on the surface of the $SiO_2$ supporting body.

TABLE 2

| Element | Point 1 Weight % | Point 1 Atomic % | Point 2 Weight % | Point 2 Atomic % |
| --- | --- | --- | --- | --- |
| OK | 18.90 | 43.79 | 35.28 | 50.77 |
| SiK | 30.17 | 39.82 | 58.53 | 47.99 |
| InL | 45.24 | 14.61 | 5.73 | 1.15 |
| SnL | 5.70 | 1.78 | 0.46 | 0.09 |
| Totals | 100.00 | 100.00 | 100.00 | 100.00 |

The present disclosure has been described with reference to embodiments and examples. However, it is understood by those skilled in the art that the present disclosure can be corrected and modified in various forms without departing from the technical concept and area described in the following claims.

What is claimed is:

1. A method for manufacturing particles, comprising:
inserting supporting bodies into receiving grooves on a first substrate to accommodate a first surface of each of the supporting bodies into each of the receiving grooves and to expose a second surface of each of the supporting bodies to outside;
forming a first coating layer on the second surface;
attaching a second substrate to the supporting bodies on which the first coating layer is formed;
exposing the first surface of each of the supporting bodies on which the first coating layer is formed by separating the supporting bodies on which the first coating layer is formed and which is attached to the second substrate from the first substrate;
forming a second coating layer on the first surface of each of the supporting bodies;
separating the supporting bodies, on which the first coating layer and the second coating layer are formed, from the second substrate, wherein the combination of the first coating layer and the second coating layer is coated on the whole surface of each of the supporting bodies; and
removing a projecting coating layer that connects the supporting bodies, the projecting coating layer comprising the first coating layer and the second coating layer which have been formed directly onto the first substrate and the second substrate; and
making the first coating layer and the second coating layer uniform,
wherein the inserting the supporting bodies into the receiving grooves includes dispersing the supporting bodies on the first substrate and applying physical pressure thereon by rubbing or pressing against the first substrate.

2. The method for manufacturing particles of claim 1, wherein the forming of the first coating layer and the forming of the second coating layer independently include vacuum evaporation, sputtering, or spin coating.

3. The method for manufacturing particles of claim 2, wherein the vacuum evaporation is performed at a temperature from about 10° C. to about 300° C.

4. The method for manufacturing particles of claim 1, wherein the second substrate further includes a polymer layer.

5. The method for manufacturing particles of claim 4, wherein the separating of the supporting bodies, on which the first coating layer and the second coating layer are formed, from the second substrate includes heating and removing the polymer layer.

6. The method for manufacturing particles of claim 1, wherein the making the first coating layer and the second coating layer uniform includes placing the supporting bodies on which the first coating layer and the second coating layer are formed between a nanostage and a plate, and moving the nanostage.

7. The method for manufacturing particles of claim 6, wherein the making the first coating layer and the second coating layer uniform further includes oxidizing the first coating layer and the second coating layer at a temperature of from about 100° C. to about 500° C.

8. The method for manufacturing particles of claim 6, wherein the moving of the nanostage includes rotating the nanostage.

9. The method for manufacturing particles of claim 6, wherein the moving of the nanostage includes moving linearly the nanostage.

10. The method for manufacturing particles of claim 6, wherein the moving of the nanostage includes rotating and moving linearly the nanostage.

11. The method for manufacturing particles of claim 1, wherein a thickness of each of the first coating layer and the second coating layer is independently from about 1 nm to about 10,000 nm.

12. The method for manufacturing particles of claim 1, wherein a size of each of the supporting bodies is from about 1 nm to about 100,000 nm.

13. The method for manufacturing particles of claim 1, wherein each of the first coating layer and the second coating layer independently includes a material selected from the group consisting of a single element metal, an alloy, a single element nonmetal, a nonmetal mixture, a metal-nonmetal mixture, a chalcogenide of nonmetal mixture, a nitride, a phosphide, a halide, and their combinations.

14. The method for manufacturing particles of claim 1, wherein the removing a projecting coating layer is performed by etching the projecting coating layer.

* * * * *